United States Patent
Casset

(10) Patent No.: US 8,607,630 B2
(45) Date of Patent: Dec. 17, 2013

(54) VIBRATING NANO-SCALE OR MICRO-SCALE ELECTROMECHANICAL COMPONENT WITH ENHANCED DETECTION LEVEL

(75) Inventor: Fabrice Casset, Tencin (FR)

(73) Assignees: Commissariat a l'energie atomique et aux energies alternatives, Paris (FR); STMicroelectronics SA, Montrouge (FR)

(*) Notice: Subject to any disclaimer, the term of this patent is extended or adjusted under 35 U.S.C. 154(b) by 463 days.

(21) Appl. No.: 12/680,687

(22) PCT Filed: Oct. 8, 2008

(86) PCT No.: PCT/EP2008/063468
§ 371 (c)(1),
(2), (4) Date: May 24, 2010

(87) PCT Pub. No.: WO2009/047266
PCT Pub. Date: Apr. 16, 2009

(65) Prior Publication Data
US 2010/0289096 A1    Nov. 18, 2010

(30) Foreign Application Priority Data
Oct. 9, 2007 (FR) ...................... 07 58173

(51) Int. Cl.
G01C 19/00 (2013.01)

(52) U.S. Cl.
USPC ....................................... 73/504.04

(58) Field of Classification Search
USPC ................. 73/504.4, 504.12, 504.16, 514.32, 73/862.59, 514.12; 310/370; 361/280; 438/379
See application file for complete search history.

(56) References Cited

U.S. PATENT DOCUMENTS

| 7,307,827 B2* | 12/2007 | Shimanouchi et al. ....... 361/278 |
| 7,578,189 B1* | 8/2009 | Mehregany ................ 73/514.18 |
| 7,610,809 B2* | 11/2009 | McNeil et al. ............. 73/514.32 |
| 2006/0273416 A1* | 12/2006 | Ayazi et al. .................... 257/414 |

FOREIGN PATENT DOCUMENTS

| FR | 2 872 501 | 1/2006 |
| FR | 2 906 238 | 3/2008 |

OTHER PUBLICATIONS

Wan-Thai Hsu, et al., "Q-Optimized Lateral Free-Free Beam Micromechanical Resonators", Digest of Technical Papers, the 11th International Conference on Solid-State Sensors & Actuators, Jun. 10-14, 2001, pp. 1110-1113.

Reza Navid, et al., "Third-Order Intermodulation Distortion in Capacitively-Driven CC-Beam Micromechanical Resonators", Micro Electro Mechanical Systems (MEMS), 2001, 4 pages.

Jing Wang, et al., "1.51-GHz Nanocrystalline Diamond Micromechanical Disk Resonator With Material-Mismatched Isolating Support", Proceedings, 17th International Micro Electro Mechanical Systems Conference, Jan. 25-29, 2004, pp. 641-644.

(Continued)

Primary Examiner — Leonard Chang
Assistant Examiner — Tamiko Bellamy
(74) Attorney, Agent, or Firm — Oblon, Spivak, McClelland, Maier & Neustadt, L.L.P.

(57) ABSTRACT

A vibrating nano-scale or micro-scale electromechanical component including a vibrating mechanical element that cooperates with at least one detection electrode. The detection electrode is flexible and is configured to vibrate in phase opposition relative to the vibrating mechanical element. Such a component may find, for example, application to resonators or motion sensors.

14 Claims, 7 Drawing Sheets

(56) References Cited

OTHER PUBLICATIONS

John R. Clark, et al., "Measurement Techniques for Capacitively-Transduced VHF-to-UHF Micromechanical Resonators", Digest of Technical Papers, the 11th International Conference on Solid-State Sensors and Actuators, Jun. 10-14, 2001, pp. 1118-1121.

Dimitri Galayko, "Filtres microelectroniques micro-usines en polysilicium couche epaisse et leur application au filtrage en frequence intermediaire", Doctoral Dissertation in materials science, Dec. 6, 2002, <URL http://www-soc.lip6.fr/~galayko/these_galayko>, 217 pages (with English abstract).

* cited by examiner

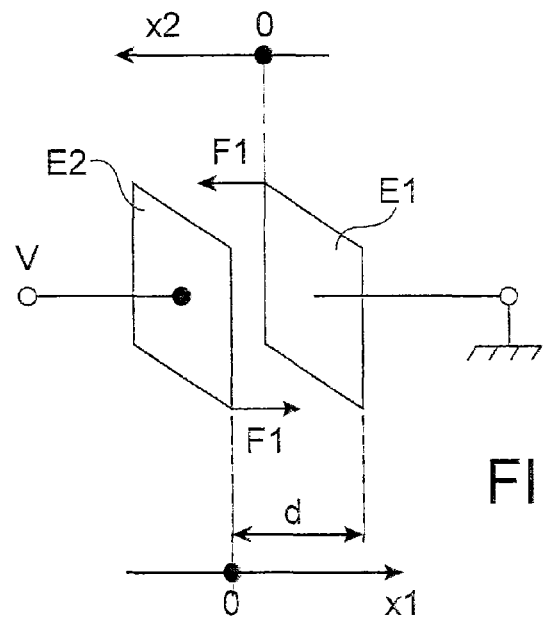
FIG.2
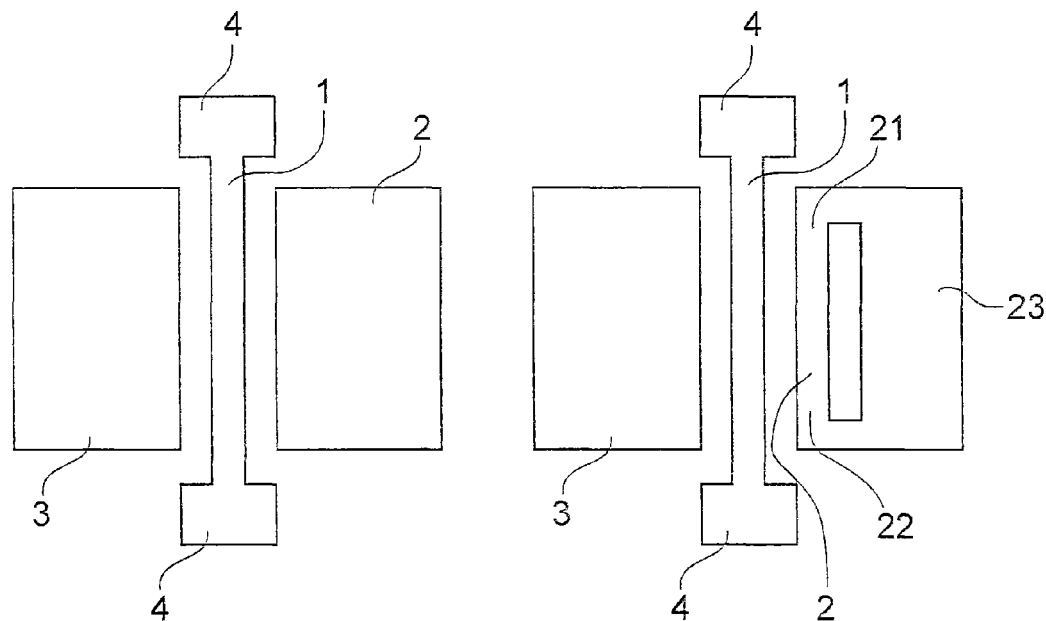
FIG.3A
PRIOR ART
FIG.3B

VIBRATING NANO-SCALE OR MICRO-SCALE ELECTROMECHANICAL COMPONENT WITH ENHANCED DETECTION LEVEL

TECHNICAL FIELD

This invention relates to a vibratable electromechanical component of nano-scale or micro-scale dimensions. These vibratable electromechanical components encompass resonators, of course, but also motion sensors, such as accelerometers or vibration sensors. Consequently, such components are called vibrating electromechanical components.

The development of increasingly smaller, high-performance portable communication devices leads to research on vibrating electromechanical components and, in particular, increasingly smaller electromechanical resonators. Portable electronic communication devices, for example, are mobile telephones, portable computers or other mobile communication terminals. These electromechanical resonators are introduced as replacements for quartz resonators; they are generally used as a filter or clock. These electromechanical resonators are being developed increasingly because of the theoretical performance levels thereof, and owing to the fact that it is desirable to integrate them.

Motion sensors can be used in personal digital assistants and other portable battery-operated equipment, in games, industrial production equipment, robotics and automobile systems. They can also be used as vibration sensors for general use in industrial equipment and electric household appliances in order to detect failures prior to the appearance of noticeable symptoms. In these fields, there is likewise a desire to gain compactness without losing performance.

PRIOR ART

Vibrating electromechanical components comprise a mechanical element capable of vibrating on a support. The mechanical vibration generates an electrical signal which will be detected by a static detection electrode. In resonators, the vibrating mechanical element has a natural resonance frequency. The resonator comes into resonance when it is excited by the excitation signal, which has the same frequency as the resonance frequency of the vibrating mechanical element. The resonance frequency is expressed as follows:

$$fr = \frac{1}{2\pi}\sqrt{\frac{kr}{m}} \qquad \text{equation 1}$$

with m the mass thereof and kr the mechanical rigidity thereof.

Several families of vibrating electromechanical components exist, among which those of which the vibrating mechanical element is a flexbeam, an elliptical or contour mode disk or a Lamé-mode polygonal plate. The frequencies are expressed by:

For the flexbeams:

$$fr = An\sqrt{\frac{E}{\rho}\frac{w}{L^2}} \qquad \text{Equation 2}$$

For the elliptical mode disks:

$$fr = \frac{k}{2\pi R}\sqrt{\frac{E}{\rho(1-\upsilon^2)}} \qquad \text{Equation 3}$$

For the Lamé-mode square plates:

$$fr = \frac{1}{2L}\sqrt{\frac{Y_{2D}}{\rho}} \qquad \text{Equation 4}$$

An is a coefficient which depends on the vibration mode chosen, and which equals 1.027 for the dominant mode, E is the Young's modulus of the beam material, ρ is the density of same, w and L are the width and length of the beam, respectively, R is the radius of the disk, υ is the Poisson's ratio of the disk, and $Y_{2D}$ represents the mechanical rigidity of the square plate.

In motion sensors, the mechanical element begins vibrating during movement, and the mechanical vibration, if it corresponds to the resonance frequency of the mechanical element, is detected by the detection electrode, the latter delivering the electrical signal at the vibration frequency of the mechanical element.

The large majority of these vibrating electromechanical components possess capacitive detection capabilities. FIG. 1 provides a schematic top view of the configuration of a vibrating electromechanical component of such a resonator. It comprises a mechanical element 1, which is capable of vibrating, and which is located in proximity to at least one stationary electrode 2. During vibration, the vibrating mechanical element 1 has a deformation in the plane of the sheet. The mechanical element 1 is shown as a beam having an anchor point 4 at each of the ends thereof.

The mechanical element 1 is polarised at the voltage Udc. In the example described, an actuating electrode 3 has been provided, which is arranged such that the mechanical element 1 is placed between it and the other so-called detection electrode 2. The two electrodes 2, 3 are opposite one another and are static. A radiofrequency signal Uac is applied to the actuating electrode 3; if this radiofrequency signal has a frequency equal to the resonance frequency of the mechanical element 1, the latter begins vibrating at the resonance frequency thereof and is subjected to a maximum displacement. By vibrating, the mechanical element 1 moves, and the movement thereof causes same to alternately move closer to and away from the detection electrode 2. A variation in capacitance modulated at the frequency of the vibrating mechanical element will occur.

At resonance, the detection electrode 2 detects a signal Sig, the frequency of which is the resonance frequency of the mechanical element 1. If the mechanical element 1 is not vibrating at the resonance frequency thereof, the detection electrode 2 does not deliver any signal. In certain configurations, there is a single electrode which is used for both actuating and detecting. The detection electrode 2 and the vibrating mechanical element 1 are spaced apart by a distance d when idle. The deformation of the vibrating mechanical element is not visible in FIG. 1.

Vibrating electromechanical components like those just described are characterised by a resonance frequency fr, a quality factor Q, which expresses the their ability to restore the excitation energy when they begin to vibrate, and a motional resistance Rm, which is based on the minimum distance to power 4 between the electrode and the vibrating mechanical element. This motional resistance Rm is inversely proportional to the quality factor Q. It models the dissipative losses of the electromechanical component. The quality factor Q depends on the vibration mode chosen for the vibrating mechanical element and the mechanical losses associated with the method of attaching the vibrating mechanical element. The resonance frequency of the vibrating mechanical element depends on the dimensions thereof. In micro-scale and nano-scale vibrating electromechanical components, the vibrating mechanical element is defined by photolithography. Therefore, using the same manufacturing method, it is possible to provide vibrating mechanical elements having several dimensions, in order to be able to take advantage of an equivalent number of resonance frequencies.

Flexbeams can vibrate in-plane (principal plane of the beam) or out-of-plane, as indicated in document [1] and document [2], respectively, the complete references of which are specified at the end of the description. They have frequencies limited to a few tens of MHz, in order to preserve performance levels enabling industrial use. Reference can be made, for example, to the beam resonator of the Discera Company, the frequency of which is 10 MHz, and the quality factor Q of which equals 4000.

Disk or polygonal plate resonators move in the plane of the disk or plate. They enable much higher resonance frequencies to be reached while at the same time preserving a high quality factor Q. Reference can be made, for example, to disk resonators from the University of Michigan, the resonance frequency of which is 1.51 GHz, as described in document [3].

Thus, in order to cover the widest possible range of frequencies, and to obtain the greatest possible variety of vibrating electromechanical components using the same manufacturing method, it is preferable to use vibrating mechanical elements having an in-plane displacement.

In order to obtain the highest possible quality factor Q, it is necessary to use the smallest possible distances between the electrode and vibrating element, because, in this way, the motional resistance is small. Much of the signal is recovered by the detection electrode.

Existing micro-scale electromechanical components have a vibrating mechanical element which is often of considerable thickness, of the order of a few micrometers, or even ten micrometers. For example, the polygonal plates and beams of the VTT Company have a thickness of 10 micrometers and a resonance frequency of 13.1 MHz, the disks from the University of Michigan have a thickness of 3 micrometers for a resonance frequency of 1.51 GHz, and the disks from the Georgia Institute of Technology have a thickness of 18 micrometers for a resonance frequency of 149.3 MHz. These vibrating mechanical elements have a large volume, which enables them to store sufficient energy for a high quality factor. However, their disadvantage is that they are difficult to integrate into active components such as transistors. They pose problems during the technological steps following definition of the vibrating mechanical element. The lithography steps are difficult to carry out because dimensional control is lost. Currently, they are generally used alone or sold encapsulated as a module.

In addition to reducing their thickness, it is sought to reduce their lateral dimensions in order to make them more compact, the reduction in overall dimensions being a constant objective nowadays. If only the thickness of the vibrating mechanical element is reduced without reducing the other dimensions thereof, the mechanical rigidity of same will be too low.

Another current objective is to raise the resonance frequency, since the frequency varies in an inversely proportional manner to the dimensions, thereby resulting in a reduction in all of the dimensions of the vibrating mechanical element.

The reduction in the size of the vibrating electromechanical component, and more particularly that of the vibrating mechanical element thereof, will directly produce increasingly smaller capacitances to measure, because the opposing electrode surfaces will also be increasingly smaller. Below a certain size, capacitive detection can no longer be carried out. For example, an in-plane flexbeam with a length L of 10 micrometers, a width w of 0.46 micrometers and a thickness h of the order of a few tens of nanometers, or even a few micrometers, will have a deformation of approximately 10 to 15 nanometers at resonance. If the at-rest value of the spacing between the detection electrode and vibrating mechanical element is of the order of 80 nanometers, which corresponds to a conventional value, then the variation in the capacitance to be measured will be only a few ato farad ($10^{-18}$ farad) for a thickness of the vibrating mechanical element of approximately 400 nm. The sensitivity limits of the measuring instruments are then reached.

DISCLOSURE OF THE INVENTION

The objective of this invention is precisely that of proposing a vibrating micro-scale or nano-scale electromechanical component which does not have the aforementioned disadvantages.

In particular, one objective is to propose a vibrating micro-scale or nano-scale electromechanical component having the highest possible quality factor and signal-to-noise ratio and the smallest possible level of motional resistance.

Yet another objective of the invention is to propose a vibrating micro-scale or nano-scale electromechanical component which is as compact as possible.

An additional objective of the invention is to propose a vibrating micro-scale or nano-scale electromechanical component having an increased resonance frequency.

To accomplish these objectives, the invention proposes to make the electrode used for detection mobile.

More precisely, the invention relates to a vibrating nano-scale or micro-scale electromechanical component comprising a vibrating mechanical element which cooperates with at least one so-called detection electrode. The detection electrode is flexible and is intended to vibrate in phase opposition relative to the vibrating mechanical element.

The vibrating electromechanical component can further comprise at least one actuating electrode which cooperates with the vibrating mechanical element.

In one particularly compact configuration, the actuating electrode can be merged with the detection electrode.

The actuating electrode and the detection electrode are preferably placed face-to-face on either side of the vibrating mechanical element.

When the electromechanical element comprises several flexible electrodes, they are preferably placed opposite an antinode of at least one mode of vibration of the vibrating mechanical element.

When there are several flexible electrodes, at least one can vibrate in a harmonic mode of the vibrating mechanical element, at least one other vibrating in another harmonic mode or in the dominant mode of the vibrating mechanical element.

The flexible electrode can be a beam operating in flex-mode.

The vibrating mechanical element can likewise be a beam operating in flex-mode.

The beam of the vibrating mechanical element can be anchored at the ends thereof or in the middle portion thereof.

Alternatively, the vibrating mechanical element can be an elliptical mode disk or a Lamé polygonal plate.

The flexible electrode can be given a length less than or equal to that of the vibrating mechanical element.

It is preferable for the vibrating mechanical element to have a degree of mechanical rigidity substantially equal to that of the flexible electrode so as to optimise the operation of the vibrating electromechanical component.

The vibrating electromechanical component can be a resonator or motion sensor such as an accelerometer or a vibration sensor.

This invention likewise relates to a method of producing a vibrating nano-scale or micro-scale electromechanical component comprising a vibrating mechanical element, which cooperates with at least one so-called detection electrode, which is flexible and is intended to vibrate in phase opposition relative to the vibrating mechanical element, comprising the following steps:

a) formation of compartment on a substrate of semiconductor material, which is bounded by dielectric material around the contour of an active region partially enclosing the vibrating mechanical element and the flexible electrode, b) filling the compartment with a sacrificial material and then with a doped semiconductor material which overflows from the compartment to form the vibrating mechanical element and the flexible electrode, c) etching at least one opening in the doped semiconductor material reaching as far as the sacrificial material in order to form a space between the mechanical vibrating element and the flexible electrode and to define the flexible electrode of a flexible electrode support, d) removal of the sacrificial material via the opening, e) covering the electromechanical component with a protective material, except for the active region, f) producing at least one electrical contact on the flexible electrode, through the protective material, and outside of the active region.

When the electromechanical component comprises at least one other electrode which is rigid, the active region partially encloses the rigid electrode; the doped semiconductor material filling the compartment and overflowing from the compartment produces the rigid electrode in step b), an opening in the doped semiconductor material is made in order to form a space between the rigid electrode and the vibrating mechanical element in step c), and, in step f), an electrical contact is produced through the protective material on the rigid electric outside of the active region.

BRIEF DESCRIPTION OF THE DRAWINGS

This invention will be better understood upon reading the description of exemplary embodiments, which are given for purely illustrative and non-limiting purposes, with reference to the appended drawings, in which:

FIG. 2 shows the principle of capacitive coupling between a conductive element driven in vibration, which is placed in proximity to another conductive element capable of vibrating;

FIGS. 3A, 3B are top views of exemplary vibrating electromechanical components of the prior art and of the invention;

Figure 1:
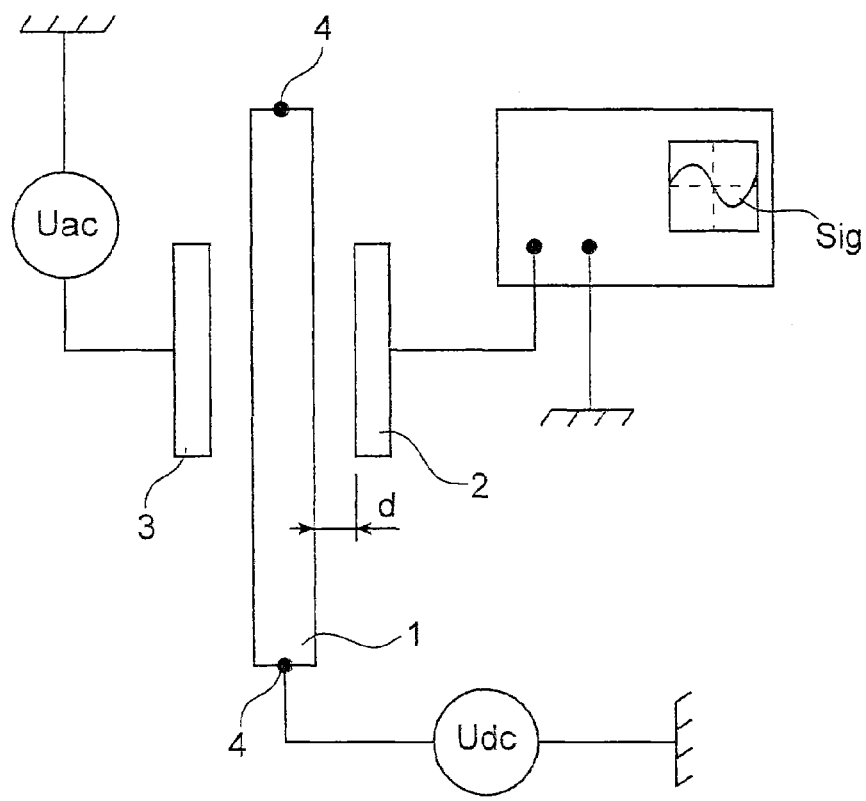
FIG. 1 is a schematic representation of a vibrating electromechanical component of the prior art.

Identical, similar or equivalent portions of the various figures described hereinbelow bear the same numerical references so as to facilitate moving from one figure to the other.

The various portions shown in the figures are not necessarily in one uniform scale, in order to make the figures more legible.

DETAILED DISCLOSURE OF PARTICULAR EMBODIMENTS

Reference will now be made to FIGS. 3A, 3B, which are schematic top views of a vibrating electromechanical component of the prior art and according to the invention.

In these examples, it is assumed that the vibrating mechanical element 1 is a beam anchored at both ends thereof, and that there is an actuating electrode 3 and a detection electrode 2, which are placed face-to-face with the beam 1 therebetween. In FIG. 3A, the two electrodes 2, 3 are identical and rigid. In FIG. 3B, the actuating electrode 3 is rigid but the detection electrode 2 is not. The detection electrode 2 is flexible; for example, it can assume the shape of a beam capable of being deformed under flexion. In the example described, it is anchored at both ends thereof, referenced as 21, 22, which are integral with a support 23. In order that the detection electrode 2 might be as efficient as possible, it is assumed that the vibrating mechanical element 1 must have the greatest vibration amplitude possible, so as to produce the greatest possible variation in capacitance in the detection electrode 2. Therefore, in order for the vibrating mechanical element 1 to have the greatest possible amplitude, for a given excitation, it is possible to reduce the mechanical rigidity thereof. This solution is not satisfactory because the resonance frequency of the vibrating mechanical element will then decrease, and that is undesirable.

In fact, the invention is based on the principle of capacitive coupling between a conductive element E1 driven in vibration, which is placed in proximity to another conductive element E2 capable of vibrating. Reference is made to FIG. 2 which illustrates this principle. When vibrating, the first conductive element E1 is subjected to an alternating force F1. The vibration of the first conductive element E1 will produce an alternating electrostatic force F2 on the second conductive element E2, which will be similar to negative rigidity. This coupling rigidity is expressed by $k_{12} = -V^2 \in_0 S/d^3$, where V is the voltage applied to the first element E1 in order to make it vibrate, S are the surfaces of the two opposing elements, and d is the spacing between the first conductive element E1 and the second conductive element E2, and $\in_0$ is the electric constant. This principle is known in the literature relating to electromechanical resonators, e.g., as in document [4]. The forces F1, F2 which are applied to the first element E1 and to the second element E2 are expressed by $F1 = -k_{12}(x1+x2)$ and $F2 = k_{12}(x2+x1)$, respectively, x1 and x2 representing the deformations at resonance of the first element E1 and the second element E2.

Figure 4A:
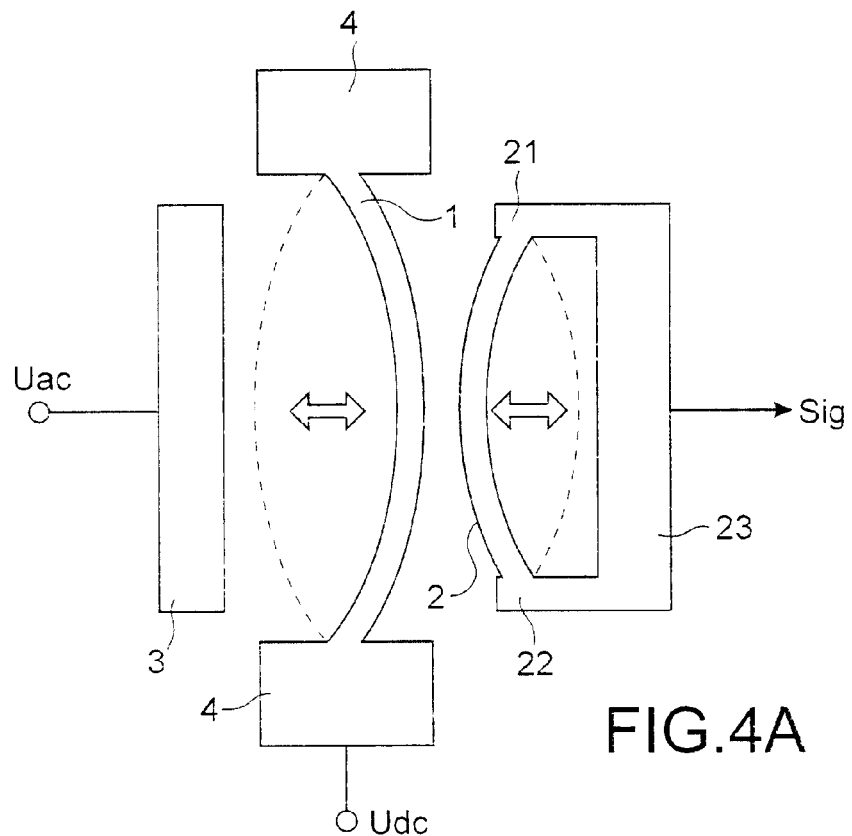
FIGS. 4A, 4B are exemplary vibrating electromechanical components and objects of the invention, in operation.
Figure 4B:
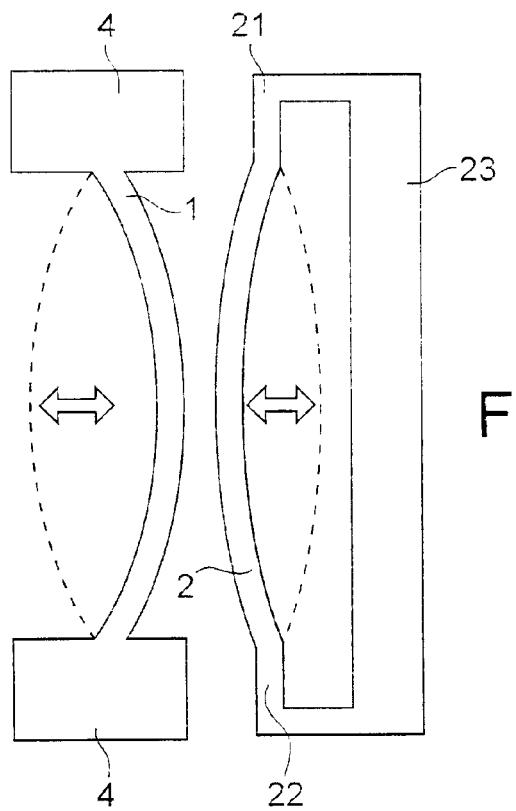

In order to obtain the greatest possible variation in capacitance in the vibrating electromechanical component, the idea, therefore, is to electrostatically couple the vibrating mechanical element 1 and the detection electrode 2 and to move the detection electrode 2 in phase opposition with the vibrating mechanical element 1. In FIGS. 3A, 3B, the vibrating electromechanical components are idle. Schematic views of vibrating electromechanical components according to the invention, in operation, are shown in FIGS. 4A, 4B. The flexible electrode 2 and the vibrating mechanical element 1 in the closest position are shown by solid lines, and the dotted lines illustrate the flexible electrode 2 and the vibrating mechanical element 1 in the most distant position. During electrostatic coupling, the flexible electrode vibrates in the dominant mode thereof. In the example of FIGS. 4A, 4B, it is assumed that the vibrating mechanical element 1 is vibrating in-plane.

With a flexible electrode 2 and a vibrating mechanical element 1 in phase opposition, the greatest possible variation in capacitance will therefore be obtained. With such a configuration, the signal-to-noise ratio will increase significantly. In addition, in the closest position, the minimum spacing between the vibrating mechanical element 1 and the flexible electrode 2 may be reduced, thereby enabling the motional resistance to be reduced and the quality factor to be increased.

In FIGS. 4A, 4B, the vibrating mechanical element 1 is vibrating in dominant mode. The same holds true for the flexible electrode 2. The flexible electrode 2 is arranged such that it is facing a maximum-amplitude vibration region of the vibrating mechanical element 1, which corresponds to an antinode.

Figure 5A:
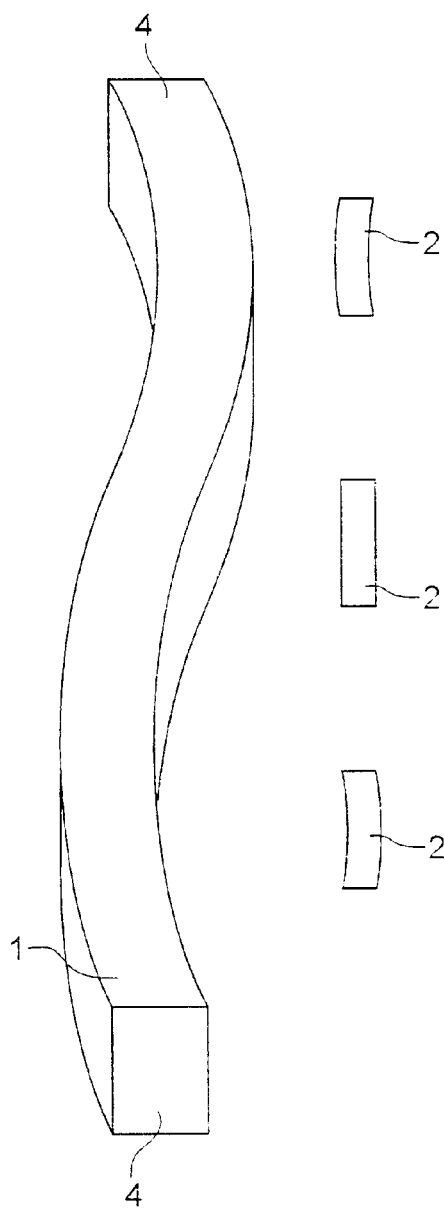
FIGS. 5A, 5B are simulations showing the deformations of a vibrating electromechanical component according to the invention, which is vibrating in the second harmonic and in the third harmonic.
Figure 5B:
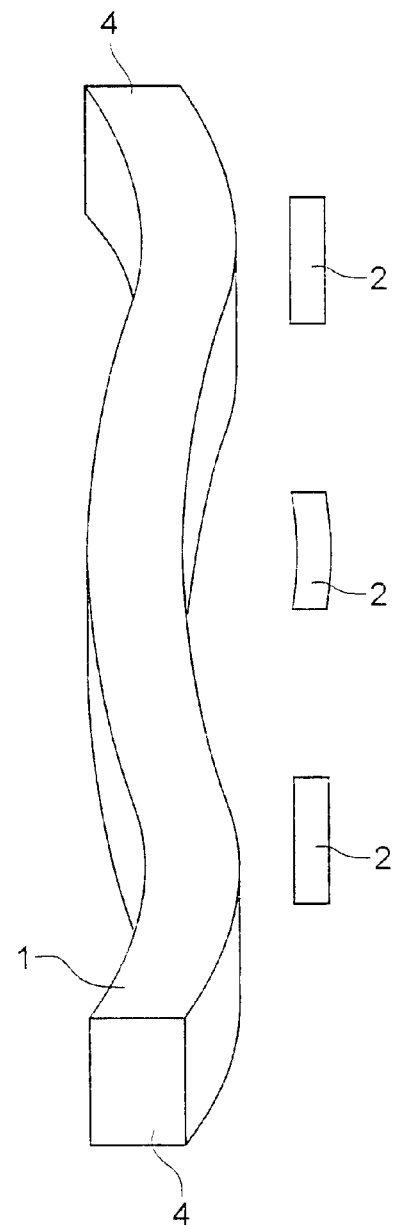

It is possible, of course, for the vibrating mechanical element 1 to vibrate in second, third or a higher-order harmonic mode, as shown in FIGS. 5A, 5B. These figures show simulations of vibrations of a vibrating mechanical element of the beam-type anchored at both ends thereof. In FIG. 5A, the vibration corresponds to the second harmonic and, in FIG. 5B, it corresponds to the third harmonic. There are several antinodes. There are several possible positions for the flexible electrode 2, and, in addition, it is possible to anticipate arranging several flexible electrodes 2 and, for a given vibration mode, using only the one or those corresponding to this mode. The flexible electrodes 2 can be used simultaneously if, for a given harmonic mode, they are placed facing an antinode, or separately, each being capable of being placed facing an antinode in a given harmonic mode. In FIGS. 5A and 5B, three flexible electrodes 2 have been arranged, which succeed one another along the beam consisting of the vibrating mechanical element 1. In FIG. 5A, the two end flexible electrodes 2 are used simultaneously, the centre flexible electrode not being used since it faces a vibration node of the vibrating mechanical element 1. The opposite occurs in FIG. 5B. In these figures, the beam-shaped vibrating mechanical element 1 has a length of 10 micrometers and a width of 0.46 micrometers. The resonance frequency is 106 MHz for the second harmonic and 206 MHz for the third harmonic. As in the prior art, of course, the flexible electrode is dimensioned such that it has a resonance frequency equal to that of the vibrating mechanical element. Depending on the vibration harmonic chosen, the resonance frequency will not be the same and the various electrodes having to operate in various harmonic modes will not have the same dimensions, as shown in FIGS. 5A, 5B.

The relationship which links the resonance frequency fr to the vibration mode and to the dimensions of the flexible electrode corresponds to equation 2.

In FIG. 4A and FIGS. 5A, 5B, the beam-shaped flexible electrode 2 is shorter than the vibrating mechanical element 1, which is itself beam-shaped. It is possible, of course, for the flexible electrode 2 and the vibrating mechanical element 1 to have substantially the same length, as shown in FIG. 4B. It could likewise be longer than the vibrating mechanical element, however, in the interests of compactness, this configuration is less advantageous.

In FIGS. 4A, 4B, it is assumed that the flexible electrode 2 is used for both detecting and actuating. In a given vibrating electromechanical component, the roles of the electrodes can change according to the use of the component. The article referenced as [5] describes several methods of characterising microelectronic resonators with several electrodes which can have different roles according to the excited modes of the vibrating mechanical element.

The operating principle of the vibrating electromechanical component according to the invention is the same as in the prior art. It will be described quickly for a resonator, by referring to FIG. 4A. The vibrating mechanical element 1 is polarised at the voltage Udc.

An excitation radiofrequency voltage Uac is applied to the actuating electrode 3. The latter can be a rigid electrode dedicated to actuation, as in FIG. 4A, or else the flexible electrode which is likewise used for detection. The radiofrequency voltage Uac induces an alternating force in the vibrating mechanical element 1. The latter will enter into vibration. The vibration of same will induce a modification in the electric field between itself and the flexible electrode 2. An alternating force will be produced on the flexible electrode 2 due to the electrostatic coupling; it will induce vibration of the flexible electrode 2 at the rhythm of the vibration of the vibrating mechanical element 1, but in phase opposition therewith. The electrostatic coupling behaves like negative rigidity, as was seen above.

When the radiofrequency voltage Uac has a frequency equal to the resonance frequency of the vibrating mechanical element 1, it enters into resonance and has a maximum displacement amplitude. When the electrostatic coupling induces an excitation frequency of the flexible electrode 2 equivalent to the resonance frequency thereof, the flexible electrode has a maximum displacement amplitude. The signal Sig "passes"; it is delivered by the flexible electrode 2. At the other frequencies, the flexible electrode 2 does not deliver any signal.

The signal-to-noise ratio of the vibrating electromechanical component depends on the difference in capacitance between the position in which the vibrating mechanical element 1 and the flexible electrode 2 are closest and the position in which the vibrating mechanical element 1 and the flexible electrode 2 are most distant. By using the flexible electrode 2 which is deformed, the difference in capacitance is increased between the state of the vibrating mechanical element 1 close to the flexible electrode 2 and the state of the vibrating mechanical element 1 distant from the flexible electrode 2.

During simulation with the Coventor software program, which is simulation software based on the finite element calculation method, movements were measured for the vibrating mechanical element and the flexible electrode of a vibrating electromechanical component similar to the one shown in FIG. 5 but operating in dominant mode. The at-rest spacing between the vibrating mechanical element and the flexible electrode is 80 nanometers. The deformation amplitude of the vibrating mechanical element and the flexible electrode is approximately 15 nanometers. During operation, the minimum spacing between the flexible electrode and the vibrating mechanical element is of the order of 50 nanometers, which is approximately 20% less than the minimum spacing obtained in the prior art, which was of the order of 65 nanometers. This reduction in minimum spacing results in an increase in the variation in capacitance since these two quantities are inversely proportional.

The motional resistance of the vibrating electromechanical component is proportional to the minimum spacing do at power 4, as shown by equation 5 below, which expresses the motional resistance of the vibrating electromechanical component in air. The quality factor Q is inversely proportional to the minimum spacing do at power 4.

$$R = \frac{kr}{\omega_0 U dc^2} \times \frac{do^4}{\varepsilon_0^2 \varepsilon_r^2 S^2} \times \frac{1}{Q}$$ Equation 5

Where $\omega_0$ is the pulsation, Udc is the bias voltage, do is the at-rest spacing between the flexible electrode and the vibrating mechanical element, kr is the mechanical rigidity of the vibrating mechanical element, $\varepsilon_0$ is the electric constant and $\varepsilon_r$ is the permittivity of the air, S represents the surface opposite the vibrating mechanical element and the flexible electrode, and Q is the quality factor of the vibrating electromechanical component.

It is thus possible to improve the quality factor Q by several tens of percents.

The vibrating electromechanical component according to the invention with a given vibrating mechanical element has a resonance frequency which is not modified relative to a vibrating electromechanical component of the prior art having the same vibrating mechanical element. On the other hand, the signal-to-noise ratio of the vibrating electromechanical component according to the invention will, on assumption, be increased by the same order of magnitude as the increase in the variation in capacitance, i.e., the decrease in the minimum spacing.

In order for the vibrating electromechanical component according to the invention to operate properly, it is preferable for the mechanical rigidity kr of the vibrating mechanical element to be substantially equal to that of the flexible electrode. The mechanical rigidity of the flexible electrode depends on the dimensions thereof and is referenced as k.

In this case, the resonance frequencies of the vibrating mechanical element and the flexible electrode will be substantially equal. The resonance frequency of the vibrating electromechanical element will be given by:

$$fr = \frac{1}{2\pi}\sqrt{\frac{k+k_{12}}{m}}$$

The flexible electrode and the vibrating mechanical element will have substantially the same displacement amplitude but these displacements will be in phase opposition.

If the flexible electrode and the vibrating mechanical element have the same length, as shown in FIG. 4B, the opposing surfaces will be maximized. The width w of the flexible electrode may be chosen by applying equation 2, so that the resonance frequencies are the same for the flexible electrode and the vibrating mechanical element.

As seen previously in FIGS. 4A and 5, it is not necessary for the flexible electrode to have the same length as the vibrating mechanical element. However, it is possible to find one or more length/width pairs for the flexible electrode which result in equal resonance frequencies. The fact of reducing the length of the flexible electrode, while at the same time placing it facing an antinode of the vibrating mechanical element, enables the initial static capacitance to be reduced, since the reduction in length also entails a reduction in width. For example, a beam measuring 10 micrometers by 0.46 micrometer will have a resonance frequency of 38.8 MHz, and a beam measuring 6 micrometers by 0.166 micrometer will have the same resonance frequency.

In conclusion, one or more flexible electrodes can be positioned along a beam-type vibrating mechanical element. If there is a single electrode, it can have the same surface dimensions as the vibrating mechanical element. If there are several of them, they will have different surface dimensions. However, the electrodes will be given a mechanical rigidity which is substantially equal to that of the vibrating mechanical element. In this way, detection of the signal is optimised, irrespective of the operating mode of the vibrating mechanical element.

Figure 6A:
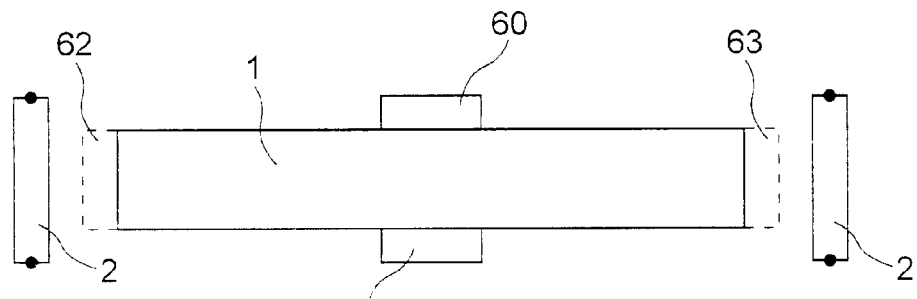
FIGS. 6A, 6B, 6C show other exemplary vibrating electromechanical components according to the invention.
Figure 6B:
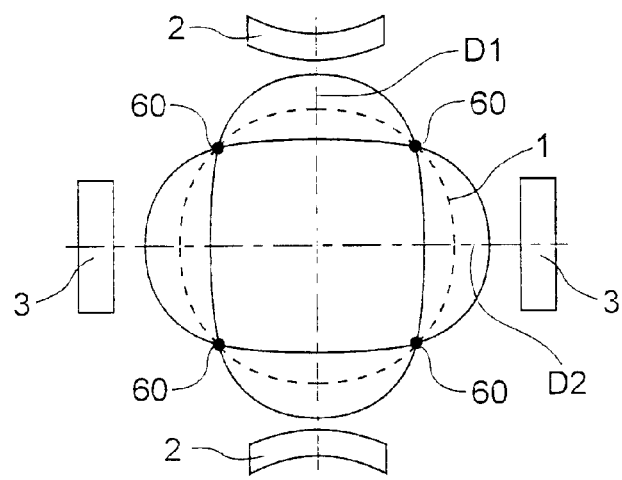
Figure 6C:
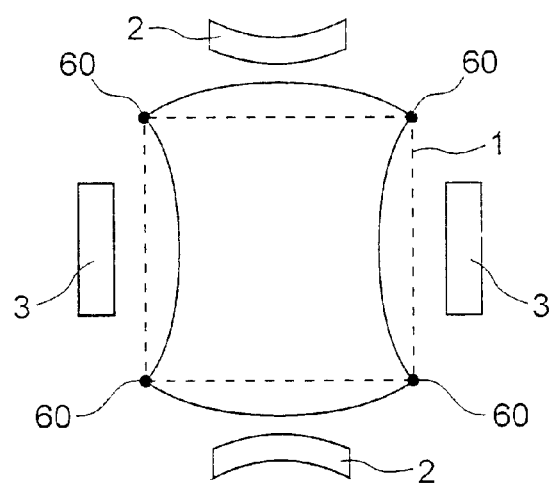

This invention likewise applies to centrally anchored beam-type vibrating mechanical elements, as shown in FIGS. 6A, 6B, 6C. In FIG. 6A, the vibrating mechanical element 1 is a beam anchored at the middle portion thereof. The anchoring is referenced as 60. There is one flexible electrode 2 arranged at each of the ends 62, 63 of same. The flexible electrodes 2 are beams anchored at the ends thereof. The dotted-line portions 61 at the ends 62, 63 of the vibrating mechanical element 1 show an outline of the lengthening of the vibrating mechanical element at resonance, i.e., an antinode. The flexible electrodes 2 face these portions resulting from the lengthening. In FIG. 6A, the flexible electrodes serve simultaneously as an actuating electrode and excitation electrodes.

In FIG. 6B, the vibrating mechanical element is a vibrating disk in an elliptical mode. It has four anchor points 60. It could be anticipated for it to comprise fewer of them; a single one would suffice. These anchor points 60 are diametrically opposite one another in pairs. The vibrating mechanical element 1 is shown by solid lines, when idle, and by dotted lines when deformed at the two end positions thereof. The anchor points 60 are placed such that the maximum deformations of the disk result in two ellipses having major axes referenced as D1, D2.

Four electrodes are shown, which are arranged in pairs, two electrodes of one pair facing one another. The two pairs are offset by substantially 90°. Each electrode 2, 3 is substantially perpendicular to the major axis D1, D2 of one of the ellipses. It is assumed that the electrodes 3 of one pair are rigid; these are actuating electrodes and they are situated substantially perpendicular to the major axis D2.

The electrodes 2 of the other pair are flexible, they are situated substantially perpendicular to the major axis D1.

FIG. 6C shows the case where the vibrating mechanical element is a substantially square plate which uses a so-called Lamé vibration mode. The anchor points referenced as 60 are situated at the corners of the plate. The plate is defined by dotted lines. Here again, there could be fewer than four anchor points; a single one suffices. The plate is shown in solid lines in one of the deformed positions thereof, with maximum degree of deformation. In the same way as previously, there are four electrodes grouped together in two pairs; the electrodes of one pair face one another. The electrodes of one pair are actuating electrodes 3 and are rigid. The electrodes of the other pair are flexible detection electrodes 2. The electrodes are substantially parallel to the sides of the square plate. The flexible electrodes 2 face the antinodes of the square plate.

A method of manufacturing a vibrating electromechanical component according to the invention will now be described. It is assumed to comprise a flexible electrode and at least one rigid electrode on either side of a vibrating mechanical element.

Figure 7A:
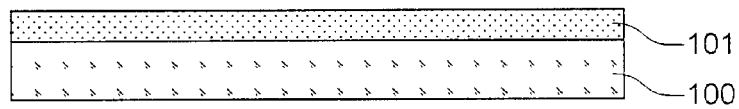
FIGS. 7A to 7J show various steps of a method of producing a vibrating electromechanical component according to the invention.

One starts with a semiconductor substrate 100, made of silicon, for example, on which a surface layer of dielectric material is formed, made of silicon oxide, for example (FIG. 7A). The oxide surface layer bears the reference number 101. It can have a thickness of between approximately 200 and 500 nanometers. The oxidation process can be a thermal oxidation process.

Figure 7B:
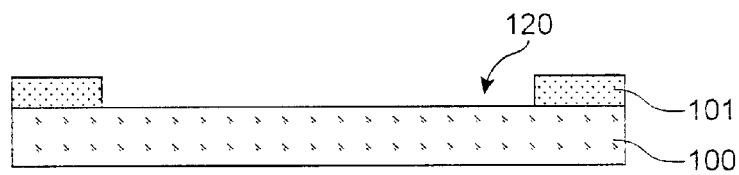

A compartment 120, which is defined laterally by layer 101, and the bottom of which exposes the substrate 100, is produced via a photolithography and etching operation (FIG. 7B). The surface of same corresponds to that of an active region of the vibrating electromechanical component, i.e., a region of the vibrating mechanical element induced to move and a region of each electrode which is situated opposite the vibrating mechanical element. This active region will be suspended when the vibrating electromechanical component is completed. This etching operation is of the plasma type, for example.

Figure 7C:
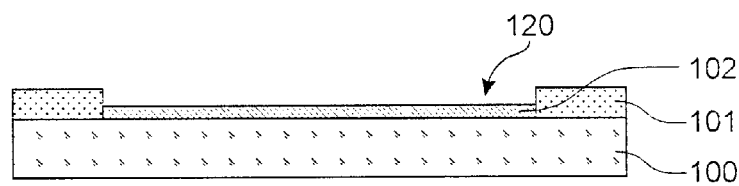

A sacrificial layer 102 is placed (FIG. 7C) at the bottom of the compartment 120, via selective epitaxial growth, for example. The sacrificial layer covers the exposed substrate 100. The material of the sacrificial layer 102, for example, can be SiGe. The sacrificial layer 102 can have a thickness of between approximately 20 to 80 nanometers.

Figure 7D:
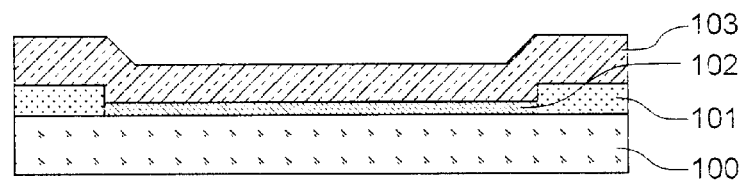

A layer 103 of semiconductor material is formed via epitaxial growth, for example (FIG. 7D). This layer 103 fills the compartment 120 and overflows therefrom. It will serve to form the vibrating electromechanical component of the invention, i.e., the vibrating mechanical element, and the two electrodes. The semiconductor material is doped and layer 103 is compliant. This doped compliant layer 103 covers both the remaining dielectric layer 101 and the previously deposited sacrificial layer 102. The semiconductor material can be boron-doped silicon, for example, with a concentration of approximately $10^{19}$ at/cm$^3$. The thickness of this doped compliant layer 103, for example, can be between approximately 100 nanometers and 1 micrometer.

Next, there is an etching step for defining the outside contour of the vibrating electromechanical component. This step is not shown and the outside contour of the component is not shown, because the figures only show the centre portion of the vibrating electromechanical component.

Figure 7E:
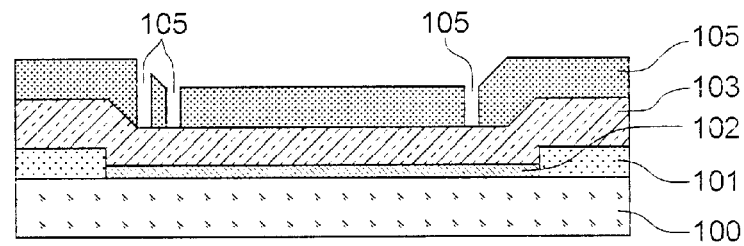

A hard surface mask 104 is produced so as to protect the doped compliant layer 103 (FIG. 7E). This hard mask 104 comprises openings 105 which correspond to the spacing between the mechanical element and each future electrode. They also correspond to the spacing between the future flexible electrode and the support thereof. The hard mask 104 can be made of silicon oxide, for example. The thickness of same can be between 50 and 150 nanometers, for example. The opening 105 can be produced by electron beam (e-beam) photolithography or by deep ultraviolet (deep UV) photolithography.

Figure 7F:
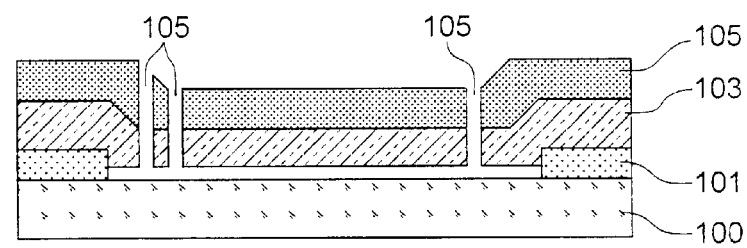
Figure 7G:
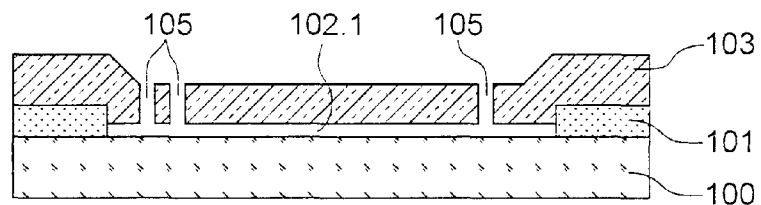

The openings 105 are deepened via another etching operation through the doped active layer 103, until the sacrificial layer 102 is reached. This etching operation can be a plasma etching operation (FIG. 7F). The following step consists of removing the sacrificial layer 102 (FIG. 7G). This removal can be carried out via plasma etching. This removal frees the active region. Another rigid electrode portion, is not freed. as well as the support for the flexible electrode; they remain on the dielectric layer 101. In this figure, the vibrating mechanical element is referenced as 103.1, the stationary electrode as 103.2, the flexible electrode by 103.3 and the support thereof by 103.4.

In addition, the hard mask 104 is removed. The void corresponding to the removal of the sacrificial layer 102 beneath the active region is referenced as 102.1.

Figure 7H:
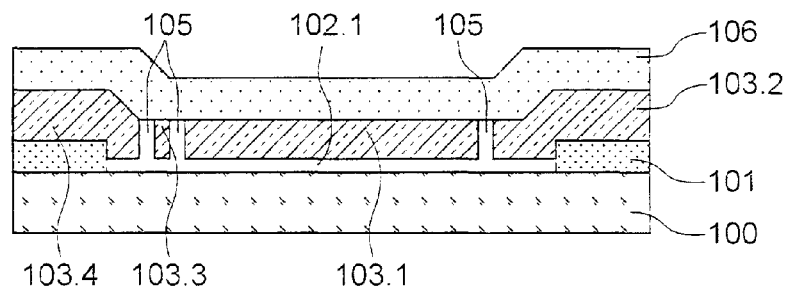
Figure 7I:
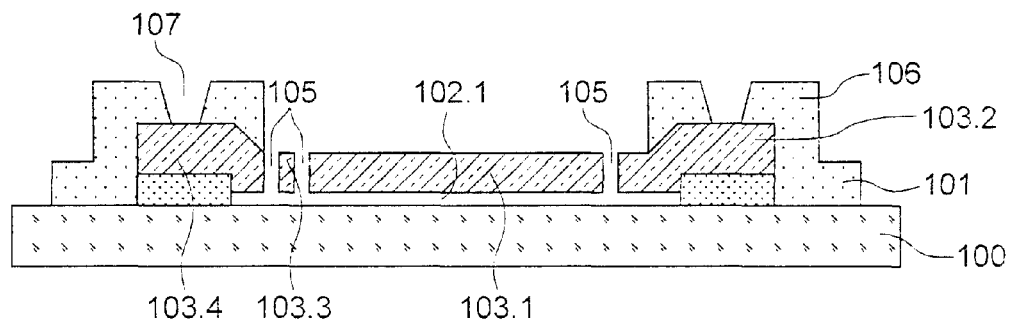

A protective surface layer 106 made of silicon oxide, for example, is then formed, on top of the doped compliant layer 103, by PECVD (acronym for plasma-enhanced chemical vapour deposition). This protective layer 106 is a compliant layer and does not penetrate into the openings 105 (FIG. 7H). This protective layer 106 extends over the active layer and thereabout, and reaches the substrate itself 100 beyond the doped compliant layer 103. This protective layer 106 is then etched, and is removed only from the active region of the electromechanical component but not from the rest of the electromechanical component. FIG. 7I shows only the left-hand portion of the vibrating electromechanical component and the rigid electrode is no longer seen.

Openings 107 are defined in the compliant protective layer 106, which reach the flexible electrode and the rigid electrode outside of the active region. These openings 107 will be used to make electrical contact pads on the electrodes. FIG. 7I shows only one opening 107 in the area of the flexible electrode support. It is not difficult to imagine the same thing on the side of the rigid electrode.

Figure 7J:
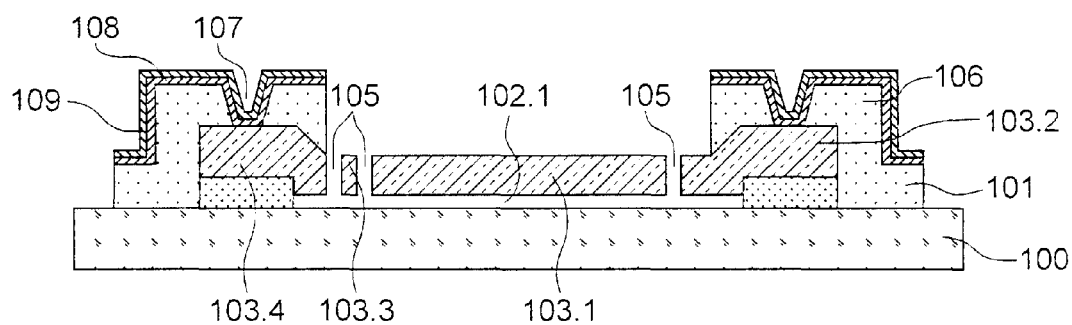

These electrical contact pads 108 in the openings 107 and conductive tracks 109 which extend them (FIG. 7J) are then produced. These electrical contact pads 108 and these tracks 109 can be made, for example, of a bilayer of a metal silicide, such as nickel silicide NiSi, and an aluminium-copper alloy AlCu.

Even though a particular embodiment of this invention has been shown and described in detail, it shall be understood that various changes and modifications can be introduced without departing from the scope of the invention.

CITED DOCUMENTS

[1] "Q-optimized lateral free-free beam micromechanical resonators", W. T. Hsu, J. R. Clark and C. T. C. Nguyen, Digest of Technical Papers, the 11$^{th}$ Int. Conf. on Solid-State Sensors and Actuators (Transducers '01) Munich, Germany, Jun. 10-14, 2001, pages 1110-1113.

[2] "Third-order intermodulation distorsion in capacitively—driven CC—beam micromechanical resonators" Navid, R.; Clarck, J. R.; Demirci; Nguyen, C. T.-C., Micro Electro Mechanical System, 2001, MEMS 2001, the 14$^{th}$ IEEE International Conference on Volume, Issue, 2001 Pages: 228-231.

[3] "1.51 GHz nanocrystalline diamond micromechanical disk resonator with material mismatched isolating support", J. Wang, J. E. Poutler, T. Feygelsen and C. T. C. Nguyen, Proceedings, 17 th Int. IEEE MEMS Conf., Maastricht, The Netherlands, Jan. 25-29 2004, pages 641-644.

[4] <<Doctoral Dissertation in materials science<< Dimitri Galayko, Dec. 6, 2002, Lille 1, 2002.

[5] "Measurement techniques for capacitively transduced VHF to UHF micromechanical resonator" J. R. Clark, W. T. Hsu, C. T. C. Nguyen Digest of Technical Papers, the 11$^{th}$ Int. Conf. on Solid-State Sensors and Actuators (Transducers '01) Munich, Germany, Jun. 10-14, 2001, pages 1118-1121.

The invention claimed is:

1. A vibrating nano-scale or micro-scale electromechanical component comprising:
   a vibrating mechanical element that cooperates with at least one detection electrode,
   wherein the detection electrode is flexible and is configured to vibrate in phase opposition relative to the vibrating mechanical element, and
   at least one actuating electrode that cooperates with the vibrating mechanical element and that makes the mechanical element vibrate.

2. A vibrating electromechanical component of claim 1, wherein the actuating electrode is merged with the detection electrode.

3. A vibrating electromechanical component of claim 1, wherein the actuating and detection electrodes are situated face-to-face on either side of the vibrating mechanical element.

4. A vibrating electromechanical component of claim 1, wherein the electromechanical element comprises plural flexible electrodes placed opposite an antinode of at least one mode of vibration of the vibrating mechanical element.

5. A vibrating electromechanical component of claim 1, comprising plural flexible electrodes, wherein at least one of the flexible electrodes vibrates in a harmonic mode of the vibrating mechanical element, at least one other of the flexible electrodes vibrating in another harmonic mode or in a dominant mode of the vibrating mechanical element.

6. A vibrating electromechanical component of claim 1, wherein the flexible electrode includes a beam operating in flex-mode.

7. A vibrating electromechanical component of claim 1, wherein the vibrating mechanical element includes a beam operating in flex-mode.

8. A vibrating electromechanical component of claim 7, wherein the beam is anchored at ends thereof or in a middle portion thereof.

9. A vibrating electromechanical component of claim 1, wherein the vibrating mechanical element includes an elliptical mode disk or a Lamé polygonal plate.

10. A vibrating electromechanical component of claim 1, wherein the flexible electrode has a length less than or equal to that of the vibrating mechanical element.

11. A vibrating electromechanical component of claim 1, wherein the vibrating mechanical element has a degree of mechanical rigidity substantially equal to that of the flexible electrode.

12. A vibrating electromechanical component of claim 1, which is a resonator or motion sensor.

13. A method of producing a vibrating nano-scale or micro-scale electromechanical component including a vibrating mechanical element, which cooperates with at least one detection electrode, which is flexible and is configured to vibrate in phase opposition relative to the vibrating mechanical element, the method comprising:
   a) forming a compartment on a substrate of semiconductor material, which is bounded by dielectric material around a contour of an active region partially enclosing the vibrating mechanical element and the flexible electrode;
   b) filling the compartment with a sacrificial material and then with a doped semiconductor material that overflows from the compartment to form the vibrating mechanical element and the flexible electrode;
   c) etching at least one opening in the semiconductor material reaching as far as the sacrificial material to form a space between the mechanical vibrating element and the flexible electrode and to define the flexible electrode of a flexible electrode support;
   d) removing the sacrificial material via the opening;
   e) covering the electromechanical component with a protective material, except for the active region; and
   f) producing at least one electrical contact pad on the flexible electrode, through the protective material, and outside of the active region.

14. A production method of claim 13, wherein the electromechanical component comprises at least one other rigid electrode, the active region partially enclosing the rigid electrode, the semiconductor material filling the compartment and overflowing from the compartment, thereby producing the rigid electrode in the filling b), an opening in the semiconductor material being made to form a space between the rigid electrode and the vibrating mechanical element in the etching c), and, in the producing f), an electrical contact is produced through the protective material on the rigid electric outside of the active region.

* * * * *

UNITED STATES PATENT AND TRADEMARK OFFICE
CERTIFICATE OF CORRECTION

| | | |
|---|---|---|
| PATENT NO. | : 8,607,630 B2 | Page 1 of 1 |
| APPLICATION NO. | : 12/680687 | |
| DATED | : December 17, 2013 | |
| INVENTOR(S) | : Fabrice Casset et al. | |

It is certified that error appears in the above-identified patent and that said Letters Patent is hereby corrected as shown below:

On the title page, Item (75), the 2nd Inventor's Information has been omitted. Item (75) should read:

--(75) Inventors:   Fabrice Casset, Tencin (FR);
　　　　　　　　　　Cedric Durand, Saint Martin D'Heres (FR)--

Signed and Sealed this
Eleventh Day of March, 2014

Michelle K. Lee
*Deputy Director of the United States Patent and Trademark Office*